United States Patent [19]
Sakishita et al.

[11] Patent Number: 5,736,896
[45] Date of Patent: Apr. 7, 1998

[54] SIGNAL PROCESSING CIRCUIT

[75] Inventors: Haruyasu Sakishita, Toyohashi; Hideaki Ishihara, Okazaki; Hirohiko Yamada, Anjo, all of Japan

[73] Assignee: Nippondenso Co., Ltd., Kariya, Japan

[21] Appl. No.: 551,913

[22] Filed: Oct. 23, 1995

[30] Foreign Application Priority Data

Oct. 21, 1994 [JP] Japan .................. 6-257208

[51] Int. Cl.$^6$ .................................. H03H 19/00
[52] U.S. Cl. .............................. 327/554; 327/337
[58] Field of Search ........................ 327/553, 554, 327/555, 557, 337; 73/35.05

[56] References Cited

U.S. PATENT DOCUMENTS

| | | | |
|---|---|---|---|
| 4,323,798 | 4/1982 | Watkins | 327/561 |
| 4,623,854 | 11/1986 | Kuraishi | 327/554 |
| 4,894,620 | 1/1990 | Nagaraj . | |
| 5,522,254 | 6/1996 | Kamabora et al. | 73/35.05 |

FOREIGN PATENT DOCUMENTS

| | | |
|---|---|---|
| 61-242405 | 10/1986 | Japan . |
| 62-082880 | 4/1987 | Japan . |
| 62-209913 | 9/1987 | Japan . |
| 62-254510 | 11/1987 | Japan . |
| 63-153907 | 6/1988 | Japan . |
| 63-181967 | 11/1988 | Japan . |
| 1-143517 | 6/1989 | Japan . |
| 1-298817 | 12/1989 | Japan . |
| 2-070115 | 3/1990 | Japan . |
| 2-096417 | 4/1990 | Japan . |
| 2-289904 | 11/1990 | Japan . |
| 3-098357 | 4/1991 | Japan . |
| 4-294640 | 10/1992 | Japan . |
| 5-075395 | 3/1993 | Japan . |
| 5-306645 | 11/1993 | Japan . |

*Primary Examiner*—Timothy P. Callahan
*Assistant Examiner*—Eunja Shin
*Attorney, Agent, or Firm*—Cushman Darby & Cushman IP Group of Pillsbury Madison & Sutro LLP

[57] ABSTRACT

A signal processing circuit includes a signal selecting device operative for selecting and outputting one of plural input signals. A filter connected to the signal selecting device filters the signal selected by the signal selecting device with a changeable center frequency of a pass band of the filtering. A frequency changing device is operative for temporarily changing the center frequency when the signal selected by the signal selecting device is changed from one to another. The filter includes, for example, a switched-capacitor filter.

39 Claims, 9 Drawing Sheets

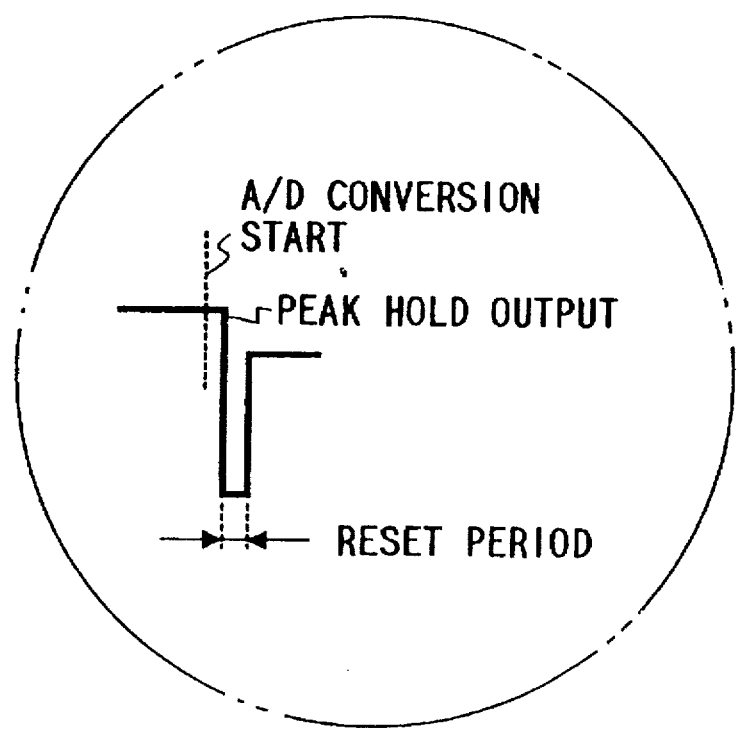
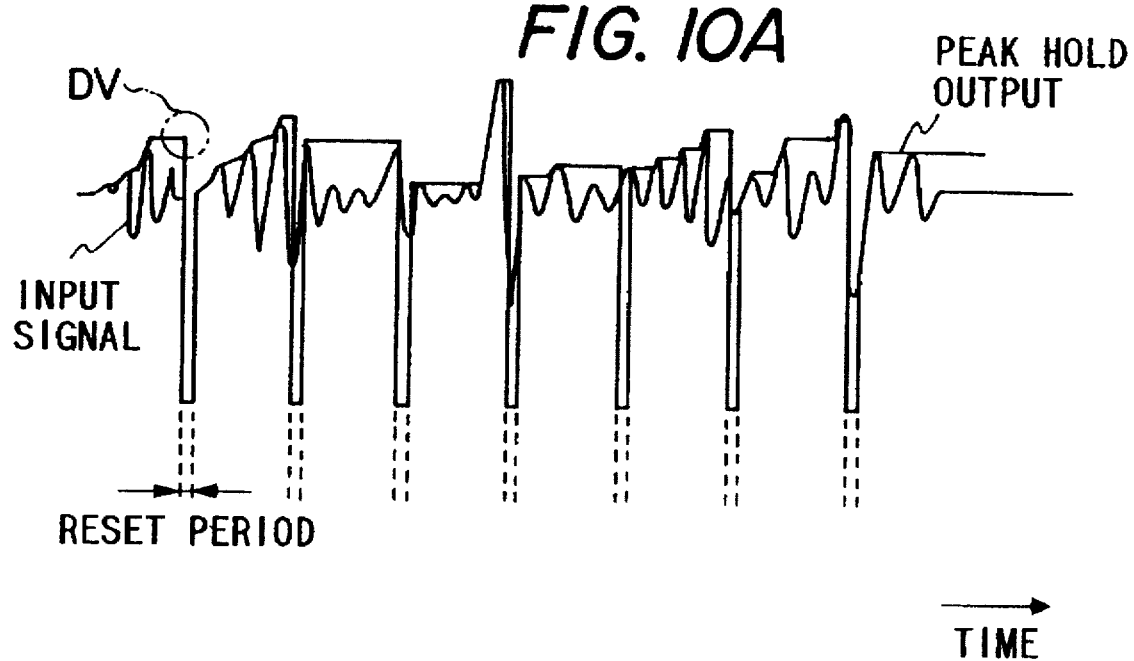

SIGNAL PROCESSING CIRCUIT

BACKGROUND OF THE INVENTION

1. Field of the Invention

This invention relates to a signal processing circuit usable in, for example, engine knock control.

2. Description of the Prior Art

In typical knock control of an automotive engine, a knock sensor attached to an engine cylinder block detects vibrations of the engine. The output signal of the knock sensor is processed by a filter to extract signal components which represent engine vibrations in a given frequency band. The peak level of the engine vibrations in the given frequency band is compared with a reference level. The result of this comparison is used in detecting whether or not a knock is present in the engine. A spark timing in the engine is adjusted in response to the result of the knock detection.

Generally, in the case of a multi-cylinder engine of a V configuration, plural knock sensors are provided, and the output signals of the knock sensors are processed by plural filters respectively. The total area occupied by the plural filters tends to be large. The plural filters generally cause a complicated structure of an electric circuit for processing the output signals of the knock sensors.

SUMMARY OF THE INVENTION

It is an object of this invention to provide an improved signal processing circuit usable in, for example, engine knock control.

A first aspect of this invention provides a signal processing circuit comprising signal selecting means for selecting and outputting one of plural input signals; a filter connected to the signal selecting means and filtering the signal selected by the signal selecting means with a changeable center frequency of a pass band of the filtering; and frequency changing means for temporarily changing the center frequency to a first value and then changing the center frequency to a second value different from the first value when the signal selected by the signal selecting means is changed from one to another.

A second aspect of this invention provides a signal processing circuit comprising a filter filtering an input signal with a changeable center frequency of a pass band of the filtering; input signal state detecting means for detecting whether or not the input signal changes to a given state in response to a condition change including at least one of an engine speed change and an engine cylinder change; and frequency changing means for temporarily changing the center frequency to a first value and then changing the center frequency to a second value different from the first value when the input signal state detecting means detects that the input signal changes to the given state.

A third aspect of this invention is based on the first aspect thereof, and provides a signal processing circuit wherein the filter comprises a switched-capacitor filter.

A fourth aspect of this invention is based on the second aspect thereof, and provides a signal processing circuit wherein the filter comprises a switched-capacitor filter.

A fifth aspect of this invention is based on the third aspect thereof, and provides a signal processing circuit wherein the frequency changing means comprises means for temporarily increasing a sampling clock frequency of the switched-capacitor filter to temporarily change the center frequency when the signal selected by the signal selecting means is changed from one to another.

A sixth aspect of this invention is based on the fourth aspect thereof, and provides a signal processing circuit wherein the frequency changing means comprises means for temporarily increasing a sampling clock frequency of the switched-capacitor filter to temporarily change the center frequency when the signal selected by the signal selecting means is changed from one to another.

A seventh aspect of this invention is based on the fifth aspect thereof, and provides a signal processing circuit wherein the frequency changing means comprises means for temporarily reducing a capacitance ratio in the switched-capacitor filter to temporarily change the center frequency when the signal selected by the signal selecting means is changed from one to another.

An eighth aspect of this invention is based on the sixth aspect thereof, and provides a signal processing circuit wherein the frequency changing means comprises means for temporarily reducing a capacitance ratio in the switched-capacitor filter to temporarily change the center frequency when the signal selected by the signal selecting means is changed from one to another.

A ninth aspect of this invention is based on the third aspect thereof, and provides a signal processing circuit further comprising a coupling capacitor, and filter signal processing means connected via the coupling capacitor to an output side of the switched-capacitor filter, the filter signal processing means including a circuit for drawing charges from the coupling capacitor.

A tenth aspect of this invention is based on the fourth aspect thereof, and provides a signal processing circuit further comprising a coupling capacitor, and filter signal processing means connected via the coupling capacitor to an output side of the switched-capacitor filter, the filter signal processing means including a circuit for drawing charges from the coupling capacitor.

An eleventh aspect of this invention is based on the third aspect thereof, and provides a signal processing circuit further comprising a pre-filter connected between the signal selecting means and the switched-capacitor filter.

A twelfth aspect of this invention is based on the tenth aspect thereof, and provides a signal processing circuit further comprising a peak hold circuit connected to a rear end of the filter signal processing means for holding a peak level of a filter signal, and a post-filter including a combination of a capacitor and a resistor, the capacitor including a hold capacitor in the peak hold circuit.

A thirteenth aspect of this invention is based on the ninth aspect thereof, and provides a signal processing circuit further comprising a peak hold circuit connected to a rear end of the filter signal processing means for holding a peak level of a filter signal, and a post-filter including a combination of a capacitor and a resistor, the capacitor including a hold capacitor in the peak hold circuit.

A fourteenth aspect of this invention is based on the twelfth aspect thereof, and provides a signal processing circuit further comprising a voltage follower circuit connected in parallel with the peak hold circuit, and switch means for selecting one of an output signal from the peak hold circuit and an output signal from the voltage follower circuit, wherein a time constant occurring selection of the output signal from the peak hold circuit is greater than a time constant occurring selection of the output signal from the voltage follower circuit.

A fifteenth aspect of this invention is based on the thirteenth aspect thereof, and provides a signal processing circuit further comprising a voltage follower circuit connected in parallel with the peak hold circuit, and switch means for selecting one of an output signal from the peak hold circuit and an output signal from the voltage follower circuit, wherein a time constant occurring selection of the output signal from the peak hold circuit is greater than a time constant occurring selection of the output signal from the voltage follower circuit.

A sixteenth aspect of this invention is based on the tenth aspect thereof, and provides a signal processing circuit wherein the filter signal processing means comprises a signal amplifying circuit including a parallel combination of plural feedback resistors, analog switches connected in series with the feedback resistors respectively, and means for changing a gain by selectively turning on and off the analog switches, and wherein a ratio among on-resistances of the analog switches is inverse with respect to a ratio in gain among resistances of the feedback resistors, and an analog switch serving as a dummy is connected in series with an input resistor of the signal amplifying circuit.

A seventeenth aspect of this invention is based on the ninth aspect thereof, and provides a signal processing circuit wherein the filter signal processing means comprises a signal amplifying circuit including a parallel combination of plural feedback resistors, analog switches connected in series with the feedback resistors respectively, and means for changing a gain by selectively turning on and off the analog switches, and wherein a ratio among on-resistances of the analog switches is inverse with respect to a ratio in gain among resistances of the feedback resistors, and an analog switch serving as a dummy is connected in series with an input resistor of the signal amplifying circuit.

An eighteenth aspect of this invention is based on the sixteenth aspect thereof, and provides a signal processing circuit further comprising gain changing means for changing the gain of the signal amplifying circuit in response to a result of the detection by the input signal state detecting means.

A nineteenth aspect of this invention is based on the seventeenth aspect thereof, and provides a signal processing circuit further comprising gain changing means for changing the gain of the signal amplifying circuit in response to a result of the detection by the input signal state detecting means.

A twentieth aspect of this invention is based on the third aspect thereof, and provides a signal processing circuit wherein the signal selecting means is operative for also selecting a reference voltage as an input signal in addition to the plural input signals, and a signal value occurring during selection of the reference voltage is detected as an offset voltage, and wherein the offset voltage is subtracted from a signal value occurring during selection of one of the plural input signals.

A twenty-first aspect of this invention is based on the ninth aspect thereof, and provides a signal processing circuit wherein a final stage of the filter signal processing means comprises an A/D converter, and a signal selector is provided in addition to the signal selecting means, and wherein the signal selector is operative for selecting one of the plural input signals and directly feeding the selected input signal to the A/D converter while enabling the selected input signal to bypass the switched-capacitor filter, the signal amplifying circuit, the peak hold circuit, and the voltage follower circuit.

A twenty-second aspect of this invention is based on the tenth aspect thereof, and provides a signal processing circuit wherein a final stage of the filter signal processing means comprises an A/D converter, and a signal selector is provided in addition to the signal selecting means, and wherein the signal selector is operative for selecting one of the plural input signals and directly feeding the selected input signal to the A/D converter while enabling the selected input signal to bypass the switched-capacitor filter, the signal amplifying circuit, the peak hold circuit, and the voltage follower circuit.

A twenty-third aspect of this invention is based on the thirteenth aspect thereof, and provides a signal processing circuit wherein the peak hold circuit comprises a reset circuit for discharging the hold capacitor to reset the held peak level.

A twenty-fourth aspect of this invention is based on the twelfth aspect thereof, and provides a signal processing circuit wherein the peak hold circuit comprises a reset circuit for discharging the hold capacitor to reset the held peak level.

A twenty-fifth aspect of this invention is based on the ninth aspect thereof, and provides a signal processing circuit further comprising means for controlling a characteristic of the filter signal processing means on a real-time basis in response to conditions including engine cylinder discrimination, an engine speed, and sensor discrimination.

A twenty-sixth aspect of this invention is based on the tenth aspect thereof, and provides a signal processing circuit further comprising means for controlling a characteristic of the filter signal processing means on a real-time basis in response to conditions including engine cylinder discrimination, an engine speed, and sensor discrimination.

A twenty-seventh aspect of this invention provides a signal processing circuit comprising a switched-capacitor filter having a variable response time; first means connected to the switched-capacitor filter for feeding an input signal to the switched-capacitor filter; second means connected to the first means for changing the input signal fed to the switched-capacitor filter by the first means from a first signal to a second signal different from the first signal; and third means connected to the switched-capacitor filter and the second means for decreasing and then increasing the response time of the switched-capacitor filter when the second means changes the input signal from the first signal to the second signal.

BRIEF DESCRIPTION OF THE DRAWINGS

FIG. 10A and 10B are time-domain diagrams of a peak hold timing and a reset timing in the signal processing circuit of FIG. 9, wherein FIG. 10B is a more detailed view of a section DV in FIG. 10A.

DESCRIPTION OF THE PREFERRED EMBODIMENTS

First Embodiment

Figure 1:
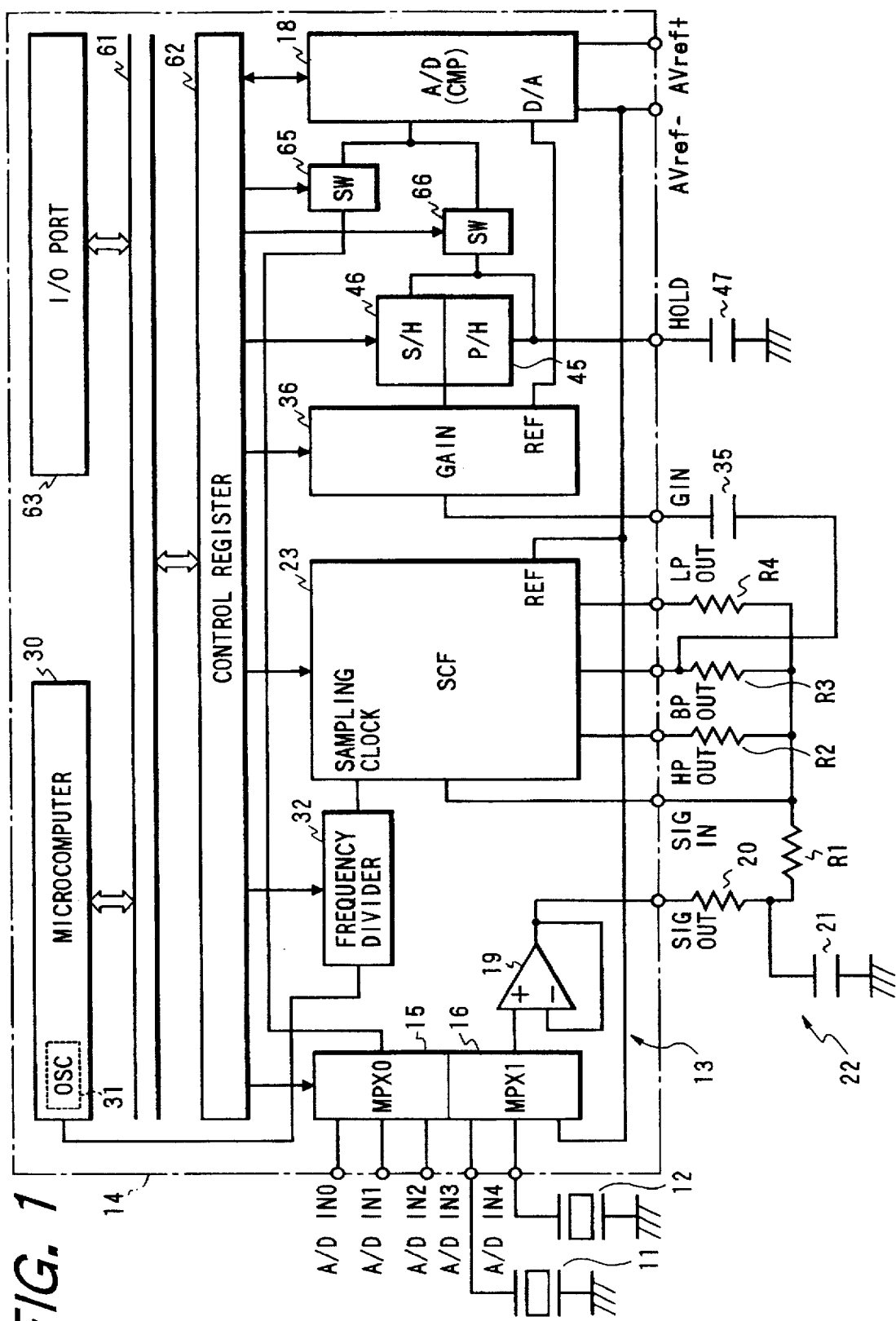
FIG. 1 is a block diagram of a signal processing circuit according to a first embodiment of this invention.

With reference to FIG. 1, knock sensors 11 and 12 are followed by a signal processing circuit 13 at least partially formed in an LSI (a large-scale integrated circuit) 14. The output signals of the knock sensors 11 and 12 are processed by the signal processing circuit 13.

Figure 2:
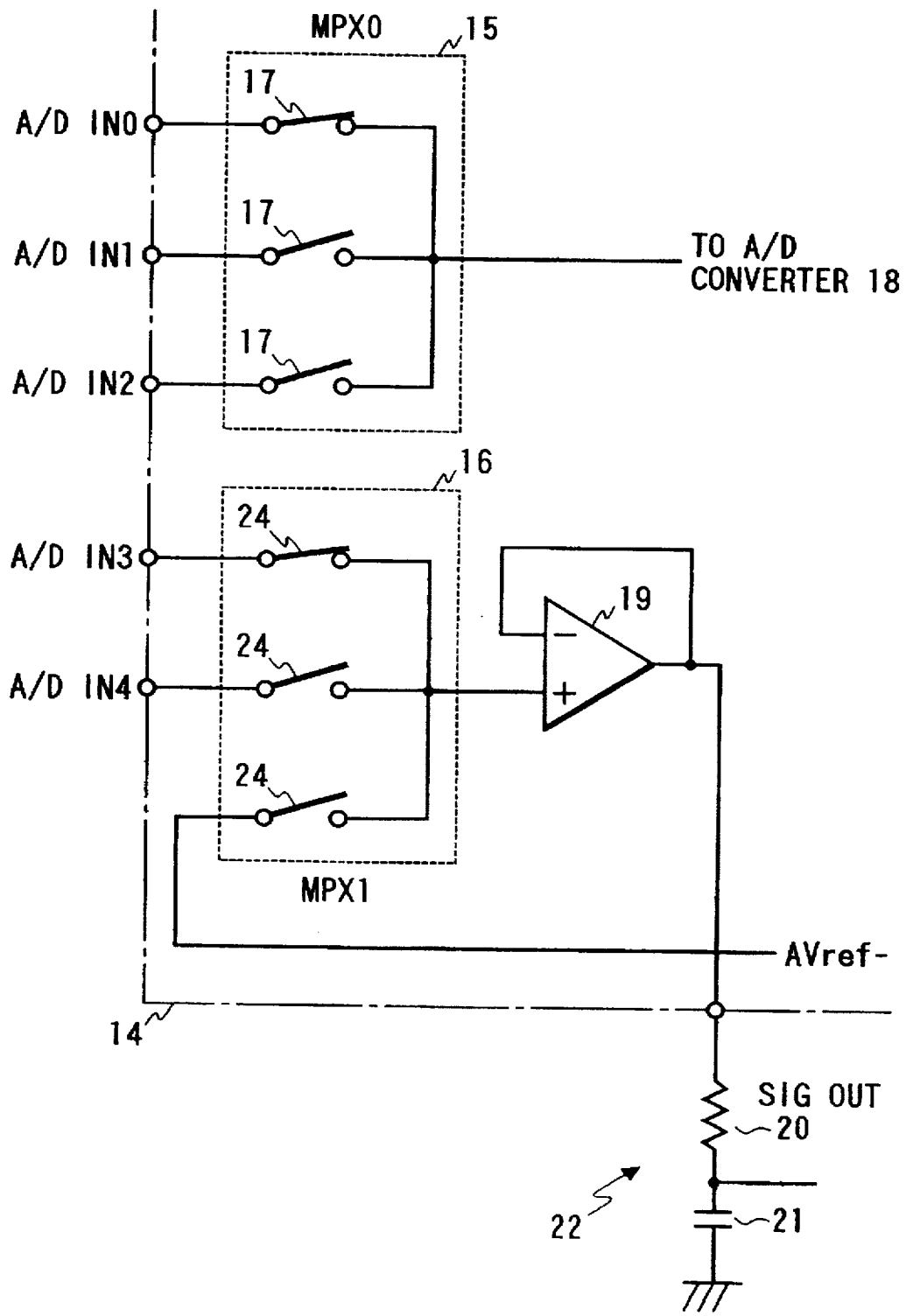
FIG. 2 is a schematic diagram of multiplexers in FIG. 1.

Multiplexers 15 and 16 (MPX0, MPX1) are provided in a front stage of the signal processing circuit 13. The multiplexer 15 (MPX0) serves as a signal selector. Three adjustment signals (three calibration signals) are fed to the multiplexer 15 (MPX0) via input terminals A/D IN0, A/D IN1, and A/D IN2 of the LSI 14. As shown in FIG. 2, the multiplexer 15 (MPX0) includes switching elements 17 for selecting one of the three adjustment signals. The output terminal of the multiplexer 15 is connected via an analog switch 65 to the input terminal of an 8-bit A/D converter 18 provided in a final stage of the signal processing circuit 13. The adjustment signal selected by the multiplexer 15 can be fed to the A/D converter 18 via the analog switch 65.

The switching elements 17 in the multiplexer 15 are controlled by control signals outputted from a control register 62. Also, the analog switch 65 is controlled by a control signal outputted from the control register 62.

The multiplexer 16 (MPX1) serves as a signal selector. The multiplexer 16 (MPX1) receives the output signals of the knock sensors 11 and 12 via input terminals A/D IN3 and A/D IN4 of the LSI 14. The multiplexer 16 (MPX1) also receives a predetermined reference voltage AVref− equal to, for example, 2.5 V. As shown in FIG. 2, the multiplexer 16 (MPX1) includes switching elements 24 for selecting one of the sensor output signals and the reference voltage AVref−. During the execution of knock control, one of the sensor output signals is sequentially and cyclically selected by the multiplexer 16 (MPX1) in response to the result of a decision regarding an engine cylinder to be subjected to an igniting process. The signal or the voltage selected by the multiplexer 16 (MPX1) is transmitted to an output terminal SIG OUT of the LSI 14 via a buffer amplifier 19 before being outputted from the LSI 14 via the output terminal SIG OUT. The buffer amplifier 19 prevents the impedance of the multiplexer 16 (MPX1) from adversely affecting a stage following the buffer amplifier 19.

The switching elements 24 in the multiplexer 16 are controlled by control signals outputted from the control register 62.

A pre-filter 22 including a series combination of a resistor 20 and a capacitor 21 is connected to the output terminal SIG OUT of the LSI 14. The pre-filter 22 is of a low pass type. A signal which has passed through the pre-filter 22 is fed to a switched-capacitor filter (an SCF) 23 in the LSI 14 via an input terminal SIG IN of the LSI 14. Thus, the output signal of the multiplexer 16 (MPX1) is transmitted to the SCF 23 via the pre-filter 22. The pre-filter is an external device with respect to the LSI 14.

The SCF 23 executes a sampling process. Accordingly, to avoid foldover or antialiasing distortion (noise) in the SCF 23, it is preferable to band-limit an incoming signal to one-half the sampling clock frequency. The pre-filter 22 executes a desired band limiting process. In the case of knock detection, the cut-off frequency of the pre-filter 22 is preferably set to about 100 kHz.

Figure 3:
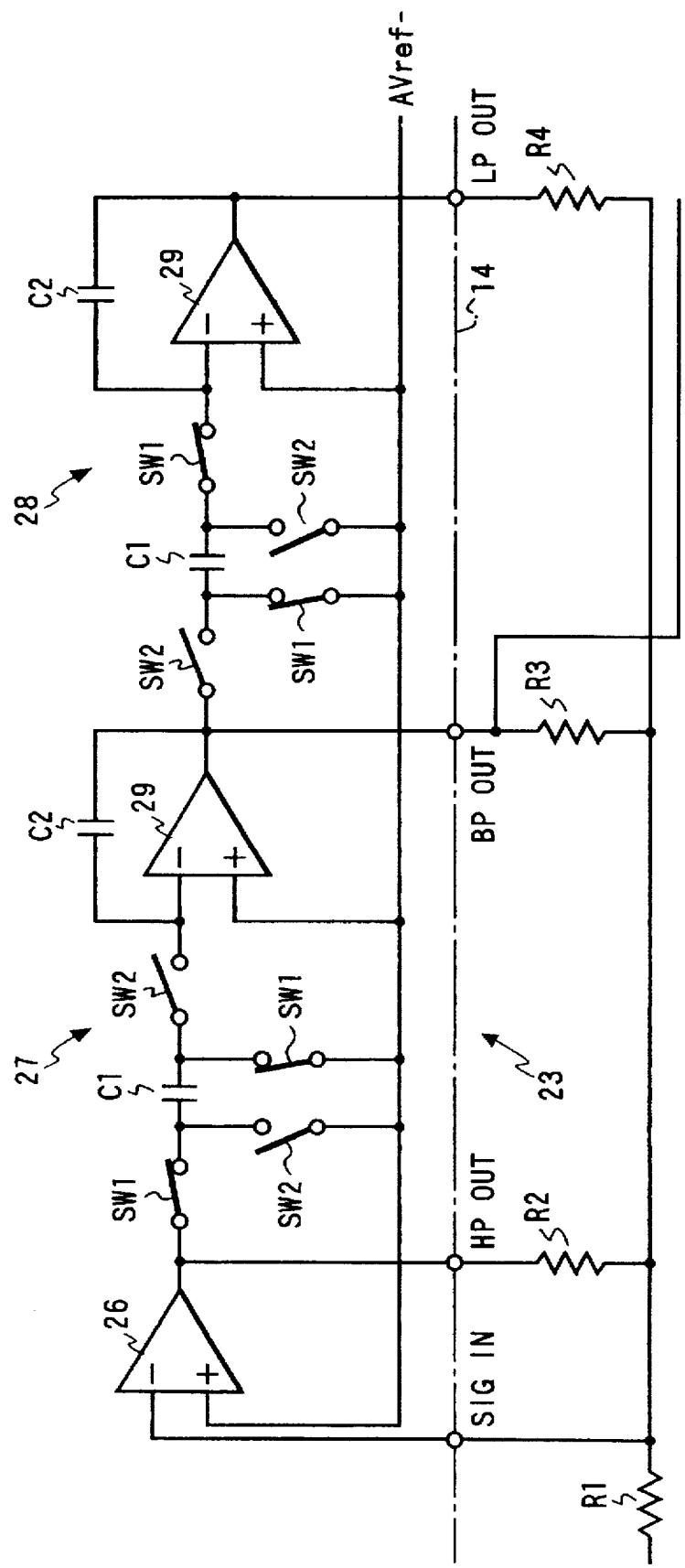
FIG. 3 is a schematic diagram of a switched-capacitor filter in FIG. 1.

As shown in FIG. 3, the SCF 23 includes an operational amplifier 26 and switched-capacitor integrators 27 and 28. The inverting input terminal of the operational amplifier 26 receives a signal transmitted via the input terminal SIG IN of the LSI 14. The non-inverting input terminal of the operational amplifier 26 receives the reference voltage AVref−. The output side of the operational amplifier 26 is successively followed by the switched-capacitor integrators 27 and 28. As will be made clear later, the SCF 23 is used as a band pass filter.

Each of the switched-capacitor integrators 27 and 28 includes capacitors C1 and C2, switching elements SW1 and SW2, and an operational amplifier 29. The switching elements SW1 and SW2 are formed by, for example, C-MOS analog switches. In each of the switched-capacitor integrators 27 and 28, the switching elements SW1 and SW2 are alternately turned on and off in synchronism with a sampling clock signal so that an incoming signal undergoes a filtering process.

As shown in FIG. 1, the sampling clock signal used in the SCF 23 is fed from a variable frequency divider 32 in the LSI 14. Specifically, a microcomputer 30 within the LSI 14 has an oscillator 31 which generates and outputs a basic clock signal having a predetermined fixed frequency. The variable frequency divider 32 receives the basic clock signal from the oscillator 31, and converts the basic clock signal to the sampling clock signal through a frequency dividing process.

The frequency of the sampling clock signal depends on a frequency division factor in the variable frequency divider 32. The frequency division factor in the variable frequency divider 32 is adjusted by a control signal outputted from the control register 62. Accordingly, the frequency of the sampling clock signal is adjusted in response to the control signal outputted from the control register 62 to the variable frequency divider 32.

As shown in FIG. 3, the output terminal of the operational amplifiers 26 leads to a high-pass-filter output terminal HP OUT of the LSI 14. The output terminal of the operational amplifier 29 in the switched-capacitor integrator 27 leads to a band-pass-filter output terminal BP OUT of the LSI 14. The output terminal of the operational amplifier 29 in the switched-capacitor integrator 28 leads to a low-pass-filter output terminal LP OUT of the LSI 14 respectively. A signal resulting from a filtering process by the SCF 23, that is, a filtering-resultant signal, is transmitted via the band-pass-filter output terminal BP OUT. Resistors R1, R2, R3, and R4 for setting filter constants or filter factors are connected to the terminals SIG IN, HP OUT, BP OUT, and LP OUT of the LSI 14 respectively. The resistors R1, R2, R3, and R4 are external with respect to the LSI 14.

The characteristics of the band pass filter formed by the SCF 23 are determined as follows. The center frequency "fo" of a pass band of the band pass filter is given by:

$$fo = \frac{fclk}{2\pi \cdot C2/C1} \cdot \sqrt{\frac{R2}{R4}} \tag{1}$$

where "fclk" denotes the sampling clock frequency; R2 and R4 denote the resistances of the resistors R2 and R4 respectively; and C2 and C1 denote the capacitances of the capacitors C2 and C1 respectively. The Q factor and the gain H of the band pass filter are given by:

$$Q = \sqrt{\frac{R2}{R4} \cdot \frac{R3}{R2}} \quad (2)$$

$$H = \frac{R3}{R1} \quad (3)$$

where R1 and R3 denote the resistances of the resistors R1 and R3 respectively.

It is known that the frequencies of engine vibrations caused by a knock in an engine (that is, the frequencies of an output signal of a knock sensor) have a fundamental frequency and harmonic frequencies. Accordingly, the center frequency "fo" of the pass band of the band pass filter can be made into agreement with the fundamental frequency of the engine vibrations by suitably setting the resistances of the resistors R2 and R4. Further, multiplying the sampling clock frequency "fclk" by an integer can make the center frequency "fo" of the pass band of the band pass filter into agreement with one of the harmonic frequencies of the engine vibrations. The multiplication of the sampling clock frequency "fclk" by an integer can be executed by the variable frequency divider 32. In general, the amplitudes of the engine vibrations at the fundamental frequency and the harmonic frequencies (the amplitudes of the corresponding-frequency components of the output signal of the knock sensor) depend on which of engine cylinders is currently subjected to an igniting process. Accordingly, it is preferable that the center frequency "fo" of the band pass filter is adjusted, in response to which of the engine cylinders is currently subjected to an igniting process, into agreement with one of the fundamental frequency and the harmonic frequencies at which the engine-vibration amplitude is maximized. This designing enables a good signal-to-noise (S/N) ratio of the filtering-resultant signal.

Figure 6:
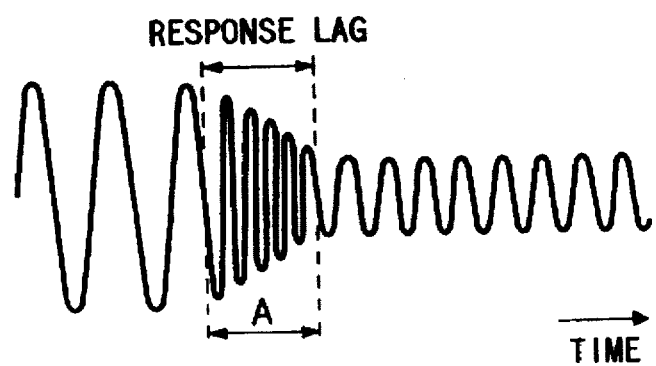
FIG. 6 is a time-domain diagram of response characteristics of the switched-capacitor filter in FIGS. 1 and 3.

The output signal from the SCF 23 follows the input signal to the SCF 23 by a time lag which determines the speed of the response of the SCF 23 to the input signal. The time lag shortens as the center frequency "fo" of the band pass filter rises. As previously described, one of the sensor output signals is sequentially and cyclically selected by the multiplexer 16 (MPX1). Each time the selected sensor output signal is changed from one to the other, the response of the SCF 23 to an incoming signal is temporarily quickened by maximizing (or increasing) the sampling clock frequency "fclk" and thereby increasing the center frequency "fo" of the band pass filter. Specifically, as shown in FIG. 6, during a given short interval "A" immediately after the change of the sensor output signals from one to the other, the response of the SCF 23 to an incoming signal is quickened so that the effect of the previously-selected sensor output signal can be promptly damped. When the given short interval "A" terminates, the sampling clock frequency "fclk" is changed to a given value corresponding to the newly-selected sensor output signal. These processes are reiterated so that the sensor output signals are sequentially and cyclically filtered by the single SCF 23 while preventing the previously-selected sensor output signal from interfering with the filtering of the newly-selected sensor output signal.

It should be noted that maximizing (or increasing) the sampling clock frequency "fclk" is executed by the control of the variable frequency divider 32.

The filtering-resultant signal is transmitted from the SCF 23 to a signal amplifying circuit 36 within the LSI 14 via the output terminal BP OUT of the LSI 14, a coupling capacitor 35, and an input terminal GIN of the LSI 14. The coupling capacitor 35 is connected between the output terminal BP OUT and the input terminal GIN of the LSI 14, forming an external device with respect to the LSI 14.

Figure 4:
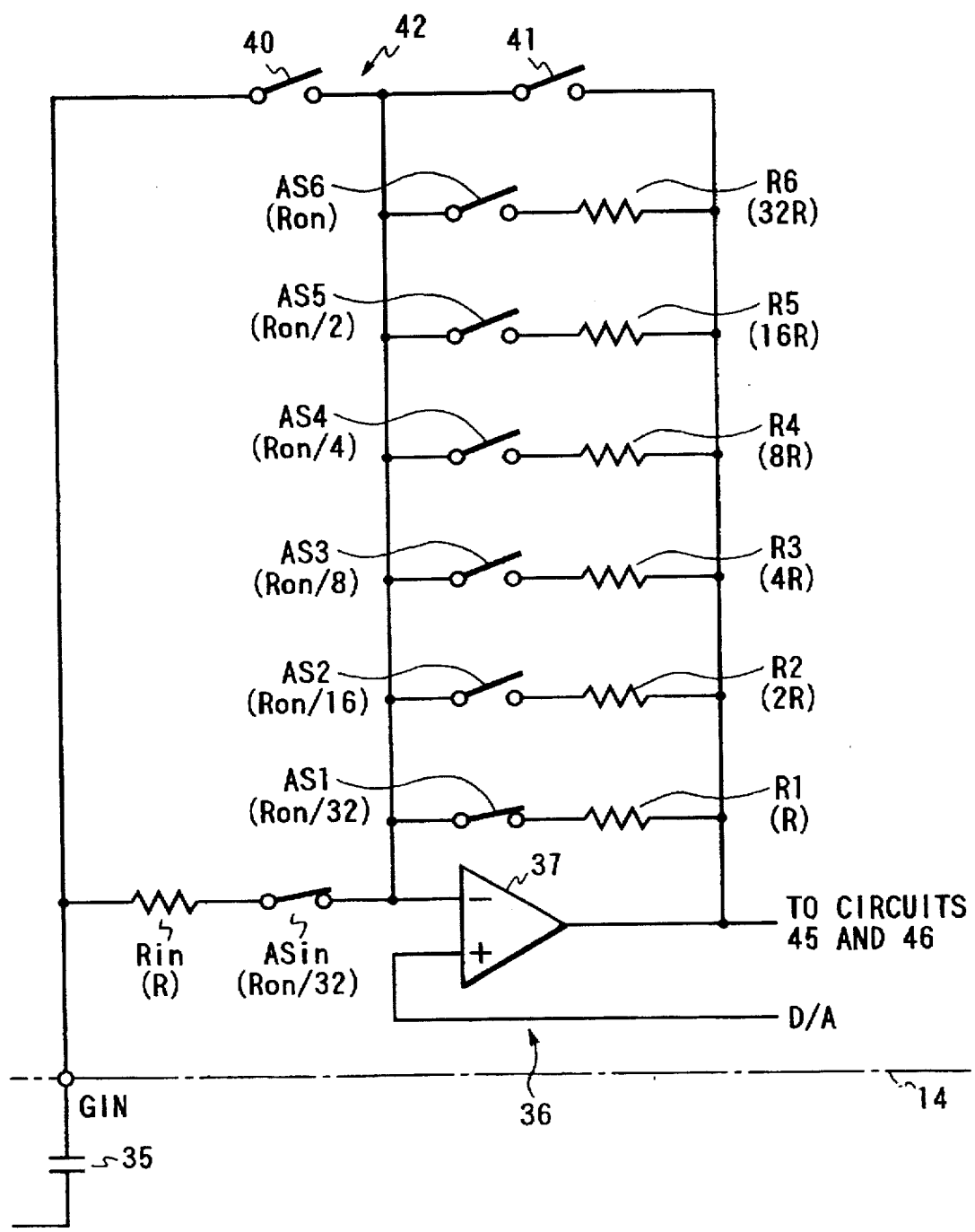
FIG. 4 is a schematic diagram of a signal amplifying circuit in FIG. 1.

As shown in FIG. 4, the signal amplifying circuit 36 includes an operational amplifier 37, resistors R1, R2, R3, R4, R5, and R6, and C-MOS analog switches AS1, AS2, AS3, AS4, AS5, and AS6. The inverting input terminal of the operational amplifier 37 is connected to the input terminal GIN of the LSI 14 via an input resistor Rin and a C-MOS analog switch ASin which is continuously closed. The resistors R1–R6 are connected in parallel with each other. The resistors R1–R6 are connected via the analog switches AS1–AS6 to the operational amplifier 37 as feedback resistors respectively. The gain of the signal amplifying circuit 36 can be changed by selectively turning on and off the analog switches AS1–AS6.

The resistances of the input resistor Rin and the feedback resistors R1–R6 are set as follows. The resistance of the input resistor Rin is set to a given value R while the resistances of the feedback resistors R1, R2, R3, R4, R5, and R6 are set to given values R, 2R, 4R, 8R, 16R, and 32R respectively. Accordingly, the gain of the signal amplifying circuit 36 can be changed among a factor of 1, a factor of 2, a factor of 4, a factor of 8, a factor of 16, and a factor of 32.

Generally, the amplitudes of the sensor output signals vary in the rage of several millivolts to several hundreds of millivolts. A wide dynamic rage of the signal processing circuit 13 can be attained by selectively turning on and off the analog switches AS1–AS6 in response to the amplitudes of the sensor output signals. It should be noted that the gain of the signal amplifying circuit 36 can be changed by selectively turning on and off the analog switches AS1–AS6.

The analog switches AS1–AS6 have certain resistances (on-resistances) when assuming on states, that is, when being closed. Such on-resistances of the analog switches AS1–AS6 are prevented from adversely affecting the values of the gain of the signal amplifying circuit 36 as described below.

The on-resistance of the analog switch AS6 is set to a given value Ron while the on-resistances of the analog switches AS1, AS2, AS3, AS4, and AS5 are set to values Ron/32, Ron/16, Ron/8, Ron/4, and Ron/2 respectively. The analog switch ASin connected in series with the input resistor Rin forms a dummy. The on-resistance of the analog switch ASin is set to a value Ron/32. As previously described, the analog switch ASin is held in an on state.

When the analog switch AS1 is in its on state and the analog switches AS2–AS6 are in their off states, the gain of the signal amplifying circuit 36 is given as (R+Ron/32)/(R+Ron/32) and is thus equal to a factor of 1. When the analog switch AS2 is in its on state and the analog switches AS1 and AS3–AS6 are in their off states, the gain of the signal amplifying circuit 36 is given as (2R+Ron/16)/(R+Ron/32) and is thus equal to a factor of 2. When the analog switch AS3 is in its on state and the analog switches AS1–AS2 and AS4–AS6 are in their off states, the gain of the signal amplifying circuit 36 is given as (4R+Ron/8)/(R+Ron/32) and is thus equal to a factor of 4. When the analog switch AS4 is in its on state and the analog switches AS1–AS3 and AS5–AS6 are in their off states, the gain of the signal amplifying circuit 36 is given as (8R+Ron/4)/(R+Ron/32) and is thus equal to a factor of 8. When the analog switch AS5 is in its on state and the analog switches AS1–AS4 and AS6 are in their off states, the gain of the signal amplifying circuit 36 is given as (16R+Ron/2)/(R+Ron/32) and is thus equal to a factor of 16. When the analog switch AS6 is in its on state and the analog switches AS1–AS5 are in their off states, the gain of the signal amplifying circuit 36 is given as (32R+Ron)/(R+Ron/32) and is thus equal to a factor of 32.

The analog switches AS1–AS6 are connected to the virtual grounding point side, that is, the inverting input terminal, of the operational amplifier 37. Accordingly, the analog switches AS1–AS6 are continuously subjected to a same voltage. Thus, the voltage characteristics of the analog switches AS1–AS6 are prevented from adversely affecting the setting values of the gain of the signal amplifying circuit 36.

The amplitudes of the sensor output signals vary in accordance with dynamical conditions such as the rotational speed of the engine. Also, the amplitudes of the sensor output signals vary in accordance with which of the engine cylinders is currently subjected to an igniting process. To compensate for such variations in the amplitudes of the sensor output signals and to attain a wide dynamic range of the signal processing circuit 13, changes of the analog switches AS1–AS6 between the on states and the off states are controlled and hence the gain of the signal amplifying circuit 36 is automatically changed in response to dynamical conditions such as the rotational speed of the engine or in response to which of the engine cylinders is currently subjected to an igniting process.

The analog switches AS1–AS6 in the signal amplifying circuit 36 are controlled by control signals outputted from the control register 62.

The coupling capacitor 35 is connected between the SCF 23 and the signal amplifying circuit 36. Normally, voltages at the opposite ends of the coupling capacitor 35 are in an equilibrium since they are equal to the voltage at the virtual grounding point of the SCF 23 and the voltage at the virtual grounding point of the signal amplifying circuit 36 respectively. When the center frequency "fo" of the SCF 23 is changed, the voltage at the virtual grounding point of the SCF 23 varies so that the voltages at the opposite ends of the coupling capacitor 35 move out of the equilibrium. To regain the equilibrium, the coupling capacitor 35 is charged (or discharged) as follows.

The virtual grounding point (that is, the inverting input terminal) of the operational amplifier 37 is connected to the end of the capacitor 35 via an analog switch 40. The output terminal of the operational amplifier 37 is connected to the virtual grounding point (that is, the inverting input terminal) of the operational amplifier 37 via an analog switch 41. The analog switches 40 and 41 compose a charging (discharging) circuit 42 which acts on the coupling capacitor 35. The analog switches 40 and 41 are normally open. When the center frequency "fo" of the SCF 23 is changed, the analog switches 40 and 41 are closed so that the coupling capacitor 35 is quickly charged (or discharged). Accordingly, it is possible to complete a charging process (or a discharging process) in a short time immediately after the change of the center frequency "fo" of the SCF 23. This designing enables different incoming signals to be successively processed while preventing the coupling capacitor 35 from causing a considerable time lag.

The analog switches 40 and 41 in the signal amplifying circuit 36 are controlled by control signals outputted from the control register 62.

The output side of the signal amplifying circuit 36 (that is, the output terminal of the operational amplifier 37) is connected to the input terminals of a peak hold circuit (P/H) 45 and a voltage follower circuit 46 for sample hold (S/H). An external hold capacitor 47 is connected to the peak hold circuit 45 via a terminal HOLD of the LSI 14.

Figure 5:
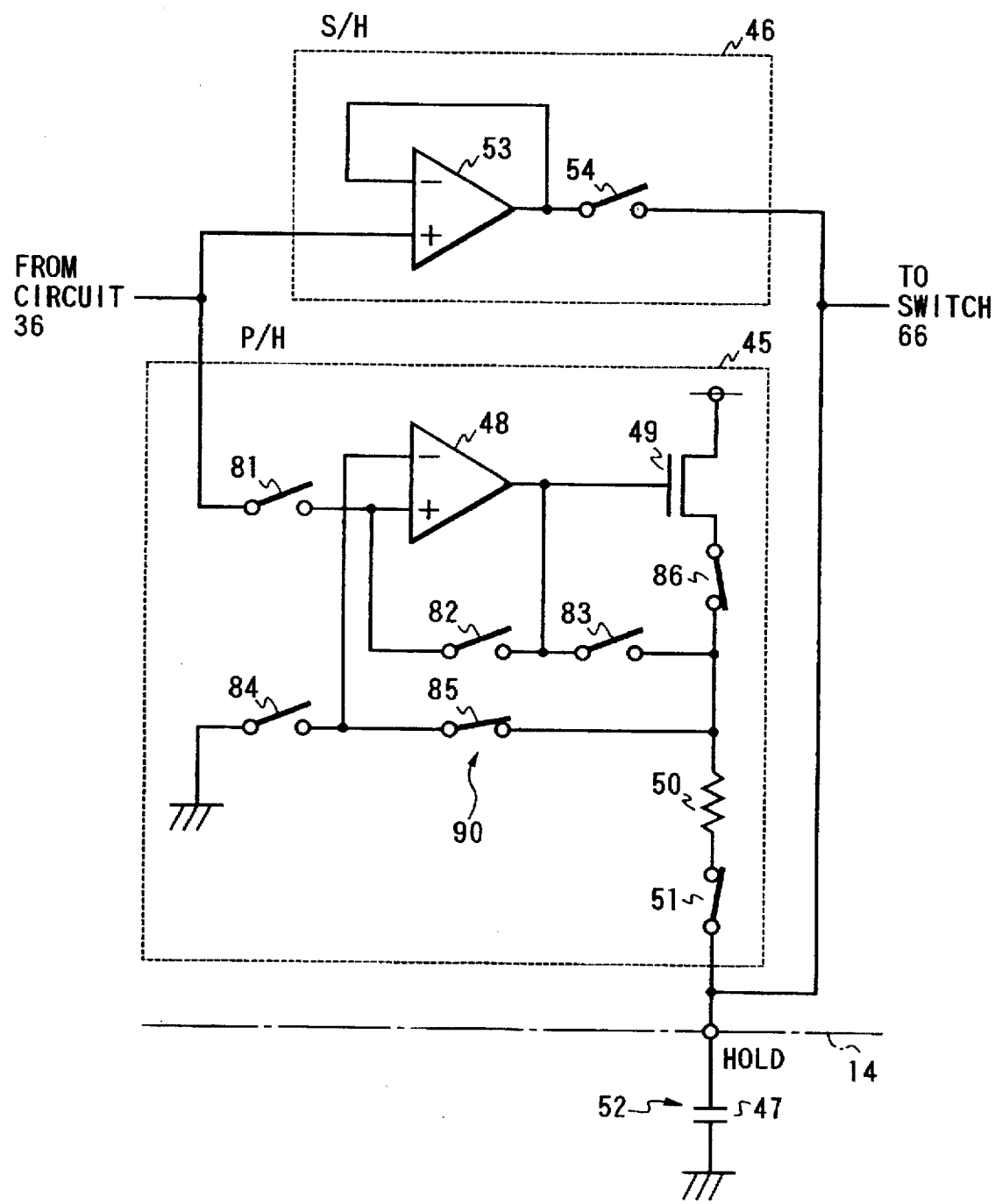
FIG. 5 is a schematic diagram of a peak hold circuit in FIG. 1.

As shown in FIG. 5, the peak hold circuit 45 includes an operational amplifier 48 serving as a voltage comparator. The peak hold circuit 45 also includes a P-MOS transistor 49 following the operational amplifier 48 and serving as a switch for selectively connecting and disconnecting the hold capacitor 45 to and from a charging power source. A first input terminal of the operational amplifier 48 receives the output signal of the signal amplifying circuit 36 via an analog switch 81. A second input terminal of the operational amplifier 48 receives the voltage across the hold capacitor 47 via an analog switch 85, a resistor 50, and an analog switch 51. When the voltage of the output signal of the signal amplifying circuit 36 is higher than the voltage across the hold capacitor 47, the operational amplifier 48 turns on the transistor 49 so that the hold capacitor 47 is charged. Otherwise, the operational amplifier 48 turns off the transistor 49 to inhibit the hold capacitor 47 from being charged. As a result, the hold capacitor 47 is enabled to hold the peak voltage of the output signal of the signal amplifying circuit 36.

The resistor 50 and the analog switch 51 are connected in series, and are provided between the hold capacitor 47 and the transistor 49. The resistor 50 and the hold capacitor 47 compose a post-filter 52 with respect to the SCF 23. The post-filter 52 has a given time constant and serves as a low pass filter which prevents high-frequency noise to be held by the hold capacitor 47. In the case where the time constant of the post-filter 52 is set to a value corresponding to a frequency between an incoming signal frequency and a foldover noise frequency, the signal peak holding function and the signal post-filtering function can be implemented by a single circuit.

The peak hold circuit 45 includes analog switches 81, 82, 83, 84, 85, and 86 composing a reset circuit 90. After each A/D conversion process is completed, this circuit 90 resets the voltage across the hold capacitor 47 to a given level by changing the analog switches 81–86 between on states and off states. When the peak voltage is held by the hold capacitor 47, the analog switches 81–86 are in the states of FIG. 5. When the voltage across the hold capacitor 47 is required to be reset, the reset circuit 90 changes the states of the analog switches 81–86 so that the hold capacitor 47 is discharged. Generally, the resetting of the voltage across the hold capacitor 47 can be quickly executed.

The analog switches 81–86 in the peak hold circuit 45 are controlled by control signals outputted from the control register 62. As shown in FIG. 5, the voltage follower circuit 46 includes an operational amplifier 53 and an analog switch 54. The operational amplifier 53 receives the output signal of the signal amplifying circuit 36. The operational amplifier 53 is followed by the analog switch 54. The analog switch 54 is controlled by a control signal outputted from the control register 62 (see FIG. 1). The operational amplifier 53 serves as a buffer with respect to the output signal of the signal amplifying circuit 36. A fail judgment (a fail detection) can be made by referring to the output signal of the voltage follower circuit 46. Further, a check of dynamical conditions such as distortion and frequency conditions of an incoming signal can be made by referring to the output signal of the voltage follower circuit 46.

As shown in FIG. 1, the hold capacitor 47 is connected to the input terminal of the A/D converter 18 via an analog switch 66. The output side of the voltage follower circuit 46, that is, the analog switch 54 (see FIG. 5), is connected to the input terminal of the A/D converter 18 via the analog switch 66. The analog switch 66 is controlled by a control signal outputted from the control register 62.

During the execution of knock control, the peak voltage held by the hold capacitor 47 is transmitted to the A/D converter 18 via the analog switch 66 before being converted into a corresponding digital signal by the A/D converter 18. In the LSI 14, the digital signal representing the peak voltage is transmitted from the A/D converter 18 to the microcomputer 30 via the control register 62 and a data bus 61. By statistically processing the digital signal of the peak voltage, the microcomputer 30 executes a judgment as to whether or not a knock is present in the engine.

During the execution of detection of a failure such as a break of electric wires to or in the knock sensors 11 and 12, the analog switch 54 at the output side of the voltage follower circuit 46 is set in an on state so that the output signal of the signal amplifying circuit 36 is transmitted to the A/D converter 18 via the voltage follower circuit 46 and the analog switch 66. The A/D converter 18 is provided with a first section for comparing the output signal of the signal amplifying circuit 36 with a given reference voltage, and a second section for digitally integrating the output signal of the signal amplifying circuit 36 in response to the result of the comparison. A fail detection (a fail judgment) is executed by referring to the result of the integration in a given time.

Further, a check on the signal amplifying circuit 36 or a check on the operational amplifier 53 can be executed by setting the analog switch 54 to its on state. Accordingly, it is possible to shorten a check time and enhance a check quality.

When the analog switch 54 is in its on state, the output side of the voltage follower circuit 46 is directly connected with the hold capacitor 47. In this case, the resistor provided by the analog switch 54 and the hold capacitor 47 compose a low-pass-type post-filter with respect to the SCF 23.

It is preferable that an incoming signal frequency "f", the cut-off frequency "fc(P/H)" of the low pass filter provided by the peak hold circuit 45, the cut-off frequency "fc(S/H)" of the low pass filter provided by the voltage follower circuit 46, and the sampling clock frequency "fclk" related to the SCF 23 have the following relation.

$$fc(P/H) < f < fc(S/H) < fclk$$

Figure 7:
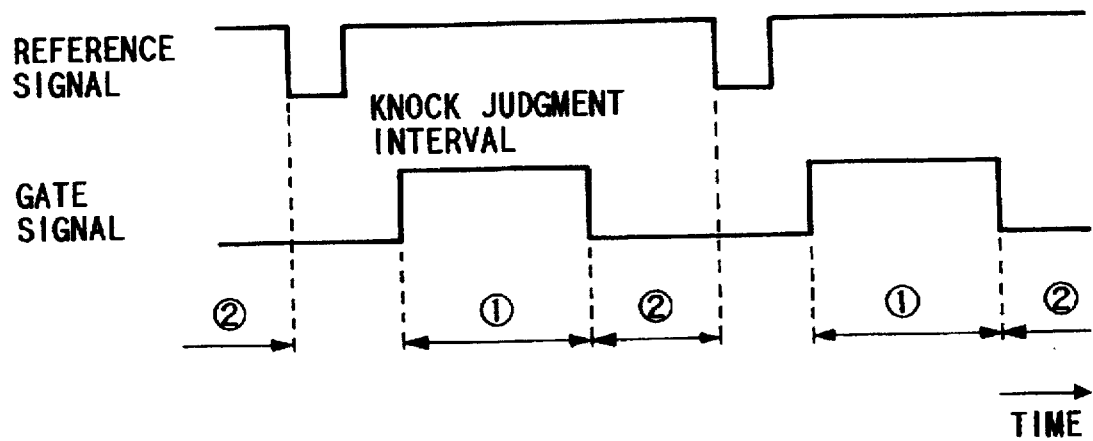
FIG. 7 is a time-domain diagram of a timing of peak detection by the peak hold circuit and a timing of fail detection by a voltage follower circuit in FIG. 1.

As shown in FIG. 7, the peak detection by the peak hold circuit 45 is periodically executed at a timing ① while the fail detection via the voltage follower circuit 46 is periodically executed at a timing ② different from the timing ①. The peak detection and the fail detection are alternately executed.

As shown in FIG. 1, the signal processing circuit 13 except the pre-filter 22, the resistors R1–R4, the coupling capacitor 35, and the hold capacitor 47 is provided in the LSI 14. Further, the microcomputer 30 is provided in the LSI 14. The microcomputer 30 feeds control signals to the control register 62 via the data bus 61. The operation and the characteristics of the signal processing circuit 13 are controlled in response to the control signals in the control register 62 on a real-time basis.

The microcomputer 30 is connected to an engine crank angle sensor (not shown). The microcomputer 30 receives an engine-cylinder discrimination signal and a reference crank angle signal from the engine crank angle sensor. The microcomputer 30 analyzes the engine-cylinder discrimination signal and the reference crank angle signal, thereby generating information of which of the engine cylinders is currently subjected to an igniting process and also information of the rotational engine speed. The microcomputer 30 generates control signals for the multiplexers 15 and 16, the SCF 23, the signal processing circuit 36, the peak hold circuit 45, the voltage follower circuit 46, the A/D converter 18, the frequency divider 32, and the analog switches 65 and 66 in response to the engine cylinder information and the engine speed information. The control signals generated by the microcomputer 30 are transmitted to the control register 62 via the data bus 61 before being stored into the control register 62. The control signals are outputted from the control register 62 to the multiplexers 15 and 16, the SCF 23, the signal processing circuit 36, the peak hold circuit 45, the voltage follower circuit 46, the A/D converter 18, the frequency divider 32, and the analog switches 65 and 66.

Accordingly, the signal selection by the multiplexer 15 and the signal selection by the multiplexer 16 are controlled in response to the engine cylinder information and the engine speed information. The variable frequency divider 32 is controlled in response to the engine cylinder information and the engine speed information. Thus, the center frequency "fo" of the pass band of the band pass filter provided by the SCF 23 is controlled in response to the engine cylinder information and the engine speed information. The gain of the signal amplifying circuit 36 is controlled in response to the engine cylinder information and the engine speed information. The quickly charging process by the signal amplifying circuit 36 is enabled and disabled in response to the engine cylinder information and the engine speed information. The selection of one of the peak detection by the peak hold circuit 45 and the fail detection by the voltage follower circuit 46 is controlled in response to the engine cylinder information and the engine speed information. A start and an end of the A/D conversion by the A/D converter 18 are controlled in response to the engine cylinder information and the engine speed information. A start and an end of the comparator conversion for the digital integration by the A/D converter 18 are controlled in response to the engine cylinder information and the engine speed information. Thus, it is possible to implement fine signal processing.

As shown in FIG. 1, the LSI 14 includes an I/O port 63 for communication with an external device such as an external microcomputer (not shown).

As previously described, the signal processing circuit 13 includes operational amplifiers. In general, the output signal from an operational amplifier has a component corresponding to an offset voltage. Accordingly, offset voltages related to the operational amplifiers in the signal amplifying circuit 36 and the peak hold circuit 45 are superimposed on the peak voltage held by the hold capacitor 47. The offset voltages are compensated or cancelled as follows.

During a period different from a time of the execution of the peak detection, the multiplexer 16 is controlled to select the reference voltage AVref–. The reference voltage AVref– is successively processed by the SCF 23, the signal amplifying circuit 36, and the peak hold circuit 45. Thus, in this case, the peak voltage held by the hold capacitor 47 corresponds to the reference voltage AVref–. The peak voltage is transmitted from the hold capacitor 47 to the A/D converter 18 via the analog switch 66, and is then converted into a corresponding digital signal by the A/D converter 18. In this way, the digital signal representing the reference voltage AVref– is generated. Generally, the reference voltage AVref– is chosen to correspond to a null state of a sensor output signal, and hence the generated digital signal represents an offset voltage. The offset-representing digital signal is transmitted from the A/D converter 18 to the microcomputer 30 via the control register 62 and the data bus 61 before being stored into a memory within the microcomputer 30.

During the execution of the peak detection, the multiplexer 16 is controlled to select one of the output signals of the knock sensors 11 and 12. The selected sensor output signal is successively processed by the SCF 23, the signal amplifying circuit 36, and the peak hold circuit 45. Thus, in this case, the peak voltage held by the hold capacitor 47 corresponds to the selected sensor output signal. The peak voltage is transmitted from the hold capacitor 47 to the A/D converter 18 via the analog switch 66, and is then converted into a corresponding digital signal by the A/D converter 18. In this way, the digital signal representing the peak voltage of the selected sensor output signal is generated. The peak-representing digital signal related to the selected sensor output signal is transmitted from the A/D converter 18 to the microcomputer 30 via the control register 62 and the data bus 61. The microcomputer 30 subtracts the value indicated by the offset-representing digital signal from the value indicated by the peak-representing digital signal, thereby detecting an accurate peak voltage of the selected sensor output signal which is free from the offset voltage.

With reference to FIG. 1, the analog switches 65 and 66 are controlled so that one of the output signal of the multiplexer 15 and the output signal of the peak hold circuit 45 (or the output signal of the voltage follower circuit 46) can be selected and fed to the A/D converter 18. During a check on the A/D converter 18, the analog switches 65 and 66 are set to an on state and an off state respectively so that the output signal of the multiplexer 15 is fed to the A/D converter 18. In the case where the microcomputer 30 requires the feed of engine-type information or other adjustment information (calibration information), the analog switches 65 and 66 are set to the on state and the off state respectively so that the output signal of the multiplexer 15 is fed to the A/D converter 18.

During a check on the A/D converter 18, a check signal can be fed to the A/D converter 18 via the multiplexer 15 and the analog switch 65 while being enabled to bypass the SCF 23, the signal amplifying circuit 36, and the peak hold circuit 45. Therefore, the check on the A/D converter 18 can be executed independent of the operation of the SCF 23, the signal amplifying circuit 36, and the peak hold circuit 45. Thus, it is possible to shorten a check time and enhance a check quality. Further, the microcomputer 30 can receive engine-type information or other adjustment information (calibration information) via the multiplexer 15 and the A/D converter 18, and the contents of control by the microcomputer 30 can be automatically adjusted in response to the received information.

As previously described, each time the selected sensor output signal is changed from one to the other, the response of the SCF 23 to an incoming signal is temporarily quickened by maximizing (or increasing) the sampling clock frequency "fclk" and thereby increasing the center frequency "fo" of the pass band of the band pass filter provided by the SCF 23. It is understood from the previously-indicated equation (1) that the center frequency "fo" of the pass band of the band pass filter increases as the ratio "C2/C1" between the capacitances of the capacitors C1 and C2 in the SCF 23 decreases. For a finer adjustment of the center frequency "fo" of the band pass filter, the capacitance ratio "C2/C1" may be changed in addition to a change of the sampling clock frequency "fclk". It should be noted that only one of the change of the capacitance ratio "C2/C1" and the change of the sampling clock frequency "fclk" may be executed to adjust the center frequency "fo" of the pass band of the band pass filter.

As previously described, after each A/D conversion process is completed by the A/D converter 18, the reset circuit 90 in the peak hold circuit 45 (see FIG. 5) resets the voltage across the hold capacitor 47 to a given level by changing the analog switches 81–86 between on states and off states. Specifically, the microcomputer 30 monitors each A/D conversion process by the A/D converter 18. When the microcomputer 30 detects and confirms an end of each A/D conversion process, the microcomputer 30 outputs an active reset control signal to the control register 62. The control register 62 feeds the active reset control signal to the reset circuit 90 in the peak hold circuit 45. The analog switches 81–86 in the reset circuit 90 are changed in response to the active reset control signal so that the voltage across the hold capacitor 47 is reset to the given level.

It should be noted that the signal processing circuit 13 may be applied to various systems other than a knock control system. Further, the multiplexer 16 may select one of three or more sensor output signals.

Second Embodiment

A second embodiment of this invention is similar to the previously-indicated first embodiment thereof except for design changes described later. The second embodiment includes an SCF 70 which replaces the SCF 23 in the first embodiment.

Figure 8:
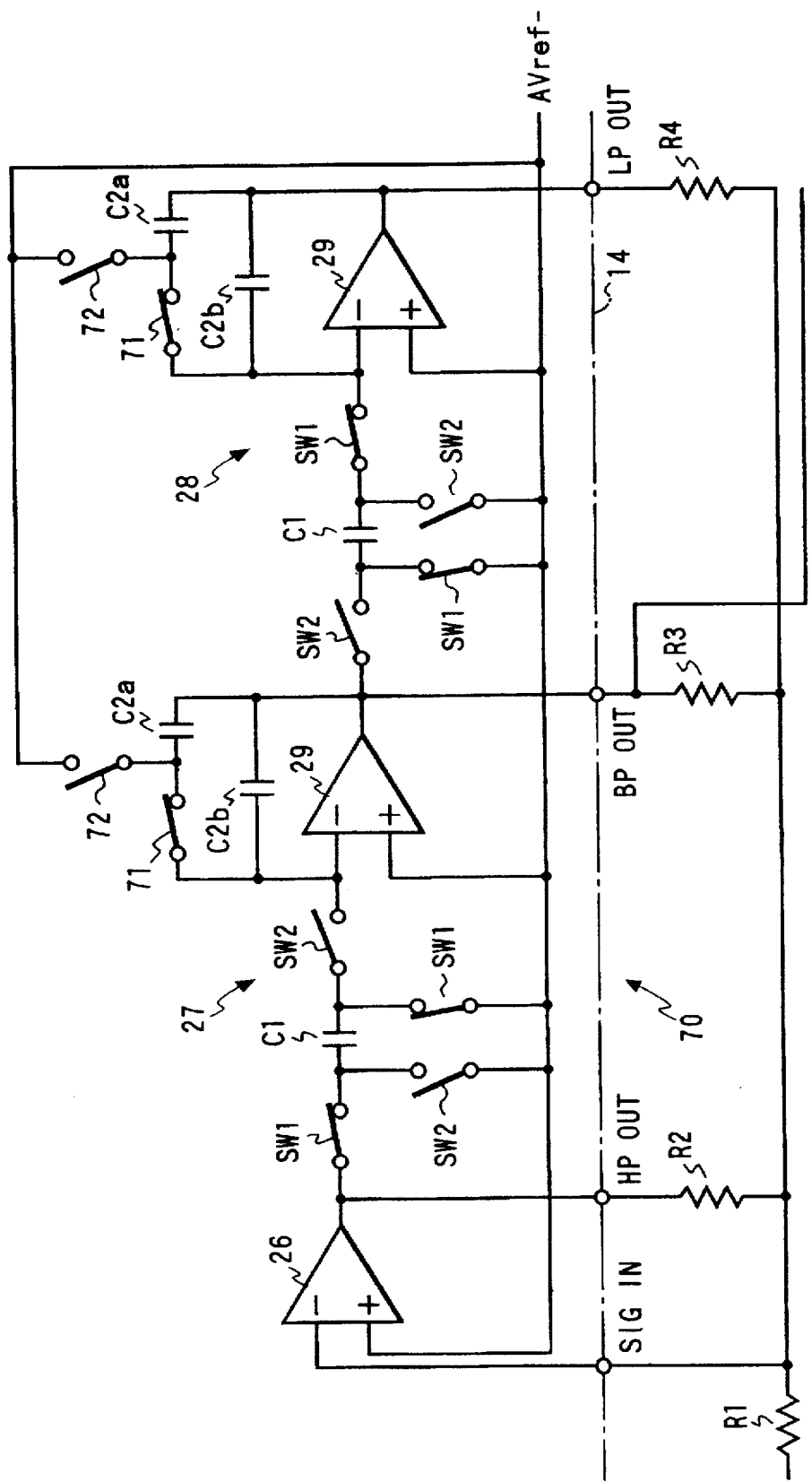
FIG. 8 is a schematic diagram of a switched-capacitor filter in a signal processing circuit according to a second embodiment of this invention.

As shown in FIG. 8, the SCF 70 includes an operational amplifier 26 and switched-capacitor integrators 27 and 28. The inverting input terminal of the operational amplifier 26 receives a signal transmitted via an input terminal SIG IN of an LSI 14. The non-inverting input terminal of the operational amplifier 26 receives a reference voltage AVref–. The output side of the operational amplifier 26 is successively followed by the switched-capacitor integrators 27 and 28. As will be made clear later, the SCF 70 is used as a band pass filter.

Each of the switched-capacitor integrators 27 and 28 includes capacitors C1, C2a, and C2b, switching elements SW1 and SW2, an operational amplifier 29, and switching elements 71 and 72. The switching elements SW1 and SW2, and the switching elements 71 and 72 are formed by, for example, C-MOS analog switches. In each of the switched-capacitor integrators 27 and 28, the operational amplifier 29 is provided with a feedback circuit having a parallel combination of the capacitors C2a and C2b. Specifically, the capacitor C2b is connected between the inverting input terminal and the output terminal of the operational amplifier 29. One end of the capacitor C2a is connected via the switching element 71 to the inverting input terminal of the operational amplifier 29 while the other end of the capacitor C2a is connected to the output terminal of the operational amplifier 29. The junction between the capacitor C2a and the switching element 71 is connected via the switching element 72 to a line subjected to the reference voltage AVref–. When the switching element 71 is changed to an off state, the switching element 72 is changed to an on state so that the potential at the capacitor C2a will be fixed to the reference voltage AVref–. The switching elements 71 and 72 cooperate to change a capacitance ratio. The switching elements 71 and 72 are changed by control signals outputted from a control register 62 (see FIG. 1). In each of the switched-capacitor integrators 27 and 28, the switching elements SW1 and SW2 are alternately turned on and off in synchronism with a sampling clock signal so that an incoming signal undergoes a filtering process.

As shown in FIG. 8, the output terminal of the operational amplifiers 26 leads to a high-pass-filter output terminal HP OUT of the LSI 14. The output terminal of the operational amplifier 29 in the switched-capacitor integrator 27 leads to a band-pass-filter output terminal BP OUT of the LSI 14. The output terminal of the operational amplifier 29 in the switched-capacitor integrator 28 leads to a low-pass-filter output terminal LP OUT of the LSI 14 respectively. A signal resulting from a filtering process by the SCF 70, that is, a filtering-resultant signal, is transmitted via the band-pass-filter output terminal BP OUT. Resistors R1, R2, R3, and R4 for setting filter constants or filter factors are connected to the terminals SIG IN, HP OUT, BP OUT, and LP OUT of the LSI 14 respectively. The resistors R1, R2, R3, and R4 are external with respect to the LSI 14.

The characteristics of the band pass filter formed by the SCF 70 are determined as follows. Normally, the switching elements 71 and 72 in each of the switched-capacitor integrators 27 and 28 are in an on state and an off state respectively. Accordingly, in the normal case, both the capacitors C2a and C2b are operatively connected to the related operational amplifier 29, and the center frequency "fo" of the pass band of the band pass filter is given by:

$$fo = \frac{fclk}{2\pi \cdot (C2a + C2b)/C1} \cdot \sqrt{\frac{R2}{R4}} \quad (4)$$

where "fclk" denotes the sampling clock frequency; R2 and R4 denote the resistances of the resistors R2 and R4 respectively; and C2a, C2b, and C1 denote the capacitances of the capacitors C2a, C2b, and C1 respectively. In the normal case, the capacitance ratio is given as "(C2a+C2b)/C1".

When a selected sensor output signal is changed from one to the other, the switching elements 71 and 72 are changed to an off state and an on state respectively. Accordingly, in this case, only the capacitor C2b is operatively connected to the related operational amplifier 29 and the potential at the capacitor C2a is fixed to the reference voltage AVref−, and the center frequency "fo" of the pass band of the band pass filter is given by:

$$fo = \frac{fclk}{2\pi \cdot C2b/C1} \cdot \sqrt{\frac{R2}{R4}} \quad (5)$$

Under these conditions, the capacitance ratio is given as "C2b/C1".

Each time the selected sensor output signal is changed from one to the other, the response of the SCF 70 to an incoming signal is temporarily quickened by reducing the capacitance ratio in the SCF 70 from "(C2a+C2b)/C1" to "C2b/C1" and thereby increasing the center frequency "fo" of the pass bad of the band pass filter provided by the SCF 70. It should be noted that the sampling clock frequency "fclk" may be increased simultaneously with the reduction of the capacitance ratio in the SCF 70.

Third Embodiment

Figure 9:
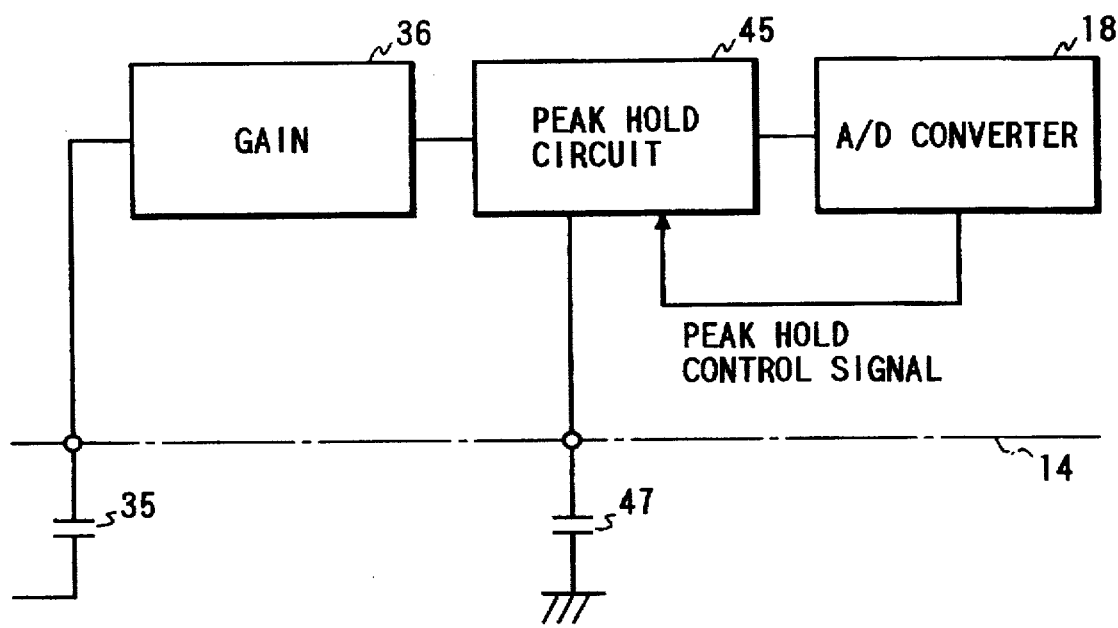
FIG. 9 is a block diagram of a part of a signal processing circuit according to a third embodiment of this invention.

FIG. 9 shows a third embodiment of this invention which is similar to the previously-indicated first embodiment thereof except for design changes described later. In the embodiment of FIG. 9, an A/D converter 18 is designed to output a peak hold control signal to a peak hold circuit 45. Specifically, the peak hold control signal is fed to analog switches 81–86 in a reset circuit 90 within the peak hold circuit 45 (see FIG. 5). The reset circuit 90 in the peak hold circuit 45 (see FIG. 5) resets the voltage across a hold capacitor 47 to a given level in response to the peak hold control signal. The A/D converter 18 outputs the peak hold control signal to the peak hold circuit 45 simultaneously with the completion of each A/D conversion process. Accordingly, the voltage across the hold capacitor 47 is promptly reset to the given level upon the completion of each A/D conversion process. After a given reset interval for which the voltage across the hold capacitor 47 is successfully decreased to the given level, the peak hold control signal is removed so that a peak holding process is restated (see FIGS. 10A and 10B.

As understood from the above description, a microcomputer 30 and a control register 62 (see FIG. 1) are excluded from sequence control of an A/D conversion process, a process of resetting the held peak voltage, and a process of starting peak detection. Accordingly, it is possible to sequentially execute an A/D conversion process, a process of resetting the held peak voltage, and a process of stating peak detection without appreciable time lags therebetween.

What is claimed is:

1. A signal processing circuit comprising:
   signal selecting means for selecting and outputting one of plural input signals;
   a filter connected to the signal selecting means and filtering the signal selected by the signal selecting means with a changeable center frequency of a pass band of the filtering; and
   frequency changing means for temporarily changing the center frequency to a first value and then changing the center frequency to a second value different from the first value when the signal selected by the signal selecting means is changed from one to another, wherein the center frequency assumes a third value different from both the first and second values as the center frequency is changed from the first value to the second value.

2. A signal processing circuit comprising:
   a filter filtering an input signal with a changeable center frequency of a pass band of the filtering;
   input signal state detecting means for detecting whether or not the input signal changes to a given state in response to a condition change including at least one of an engine speed change and an engine cylinder change; and
   frequency changing means for temporarily changing the center frequency to a first value and then changing the center frequency to a second value different from the first value when the input signal state detecting means detects that the input signal changes to the given state, wherein the center frequency assumes a third value different from both the first and second values as the center frequency is changed from the first value to the second value.

3. The signal processing circuit of claim 1, wherein the filter comprises a switched-capacitor filter.

4. The signal, processing circuit of claim 2, wherein the filter comprises a switched-capacitor filter.

5. The signal processing circuit of claim 3, wherein the frequency changing means comprises means for temporarily increasing a sampling clock frequency of the switched-capacitor filter to temporarily change the center frequency to the third value as the signal selected by the signal selecting means is changed from one to another.

6. The signal processing circuit of claim 4, wherein the frequency changing means comprises means for temporarily increasing a sampling clock frequency of the switched-capacitor filter to temporarily change the center frequency to the first value.

7. The signal processing circuit of claim 5, wherein the frequency changing means comprises means for temporarily reducing a capacitance ratio in the switched-capacitor filter to temporarily change the center frequency to the third value as the signal selected by the signal selecting means is changed from one to another.

8. The signal processing circuit of claim 6, wherein the frequency changing means comprises means for temporarily reducing a capacitance ratio in the switched-capacitor filter to temporarily change the center frequency to the third value.

9. The signal processing circuit of claim 3, further comprising a coupling capacitor, and filter signal processing means connected via the coupling capacitor to an output side of the switched-capacitor filter, the filter signal processing means including a circuit for drawing charges from the coupling capacitor as the center frequency is changed from the first value to the second value.

10. The signal processing circuit of claim 4, further comprising a coupling capacitor, and filter signal processing means connected via the coupling capacitor to an output side of the switched-capacitor filter, the filter signal processing means including a circuit for drawing charges from the coupling capacitor as the center frequency is changed from the first value to the second value.

11. The signal processing circuit of claim 3, further comprising a pre-filter connected between the signal selecting means and the switched-capacitor filter.

12. The signal processing circuit of claim 10, further comprising a peak hold circuit connected to a rear end of the filter signal processing means for holding a peak level of a filter signal, and a post-filter including a combination of a capacitor and a resistor, the capacitor including a hold capacitor in the peak hold circuit.

13. The signal processing circuit of claim 9, further comprising a peak hold circuit connected to a rear end of the filter signal processing means for holding a peak level of a filter signal, and a post-filter including a combination of a capacitor and a resistor, the capacitor including a hold capacitor in the peak hold circuit.

14. The signal processing circuit of claim 12, further comprising a voltage follower circuit connected in parallel with the peak hold circuit, and switch means for selecting one of an output signal from the peak hold circuit and an output signal from the voltage follower circuit, wherein a time constant occurring selection of the output signal from the peak hold circuit is greater than a time constant occurring selection of the output signal from the voltage follower circuit.

15. The signal processing circuit of claim 13, further comprising a voltage follower circuit connected in parallel with the peak hold circuit, and switch means for selecting one of an output signal from the peak hold circuit and an output signal from the voltage follower circuit, wherein a time constant occurring selection of the output signal from the peak hold circuit is greater than a time constant occurring selection of the output signal from the voltage follower circuit.

16. The signal processing circuit of claim 10, wherein the filter signal processing means comprises a signal amplifying circuit including a parallel combination of plural feedback resistors, analog switches connected in series with the feedback resistors respectively, and means for changing a gain by selectively turning on and off the analog switches, and wherein a ratio among on-resistances of the analog switches is inverse with respect to a ratio in gain among resistances of the feedback resistors, and an analog switch serving as a dummy is connected in series with an input resistor of the signal amplifying circuit.

17. The signal processing circuit of claim 9, wherein the filter signal processing means comprises a signal amplifying circuit including a parallel combination of plural feedback resistors, analog switches connected in series with the feedback resistors respectively, and means for changing a gain by selectively turning on and off the analog switches, and wherein a ratio among on-resistances of the analog switches is inverse with respect to a ratio in gain among resistances of the feedback resistors, and an analog switch serving as a dummy is connected in series with an input resistor of the signal amplifying circuit.

18. The signal processing circuit of claim 16, further comprising gain changing means for changing the gain of the signal amplifying circuit in response to a result of the detection by the input signal state detecting means.

19. The signal processing circuit of claim 17, further comprising gain changing means for changing the gain of the signal amplifying circuit.

20. The signal processing circuit of claim 3, wherein the signal selecting means is operative for also selecting a reference voltage as an input signal in addition to the plural input signals, and a signal value occurring during selection of the reference voltage is detected as an offset voltage, and wherein the offset voltage is subtracted from a signal value occurring during selection of one of the plural input signals.

21. The signal processing circuit of claim 9, wherein a final stage of the filter signal processing means comprises an A/D converter, and a signal selector is provided in addition to the signal selecting means, and wherein the signal selector is operative for selecting one of the plural input signals and directly feeding the selected input signal to the A/D converter while enabling the selected input signal to bypass the switched-capacitor filter.

22. The signal processing circuit of claim 10, wherein a final stage of the filter signal processing means comprises an A/D converter, and a signal selector is provided, and wherein the signal selector is operative for selecting one of plural input signals and directly feeding the selected input signal to the A/D converter while enabling the selected input signal to bypass the switched-capacitor filter.

23. The signal processing circuit of claim 13, wherein the peak hold circuit comprises a reset circuit for discharging the hold capacitor to reset the held peak level.

24. The signal processing circuit of claim 12, wherein the peak hold circuit comprises a reset circuit for discharging the hold capacitor to reset the held peak level.

25. The signal processing circuit of claim 9, further comprising means for controlling a characteristic of the filter signal processing means on a real-time basis in response to conditions including engine cylinder discrimination, an engine speed, and sensor discrimination.

26. The signal processing circuit of claim 10, further comprising means for controlling a characteristic of the filter signal processing means on a real-time basis in response to conditions including engine cylinder discrimination, an engine speed, and sensor discrimination.

27. A signal processing circuit comprising:
a switched-capacitor filter having a variable response time;
first means connected to the switched-capacitor filter for feeding an input signal to the switched-capacitor filter;
second means connected to the first means for changing the input signal fed to the switched-capacitor filter by the first means from a first signal to a second signal different from the first signal; and
third means connected to the switched-capacitor filter and the second means for decreasing and then increasing the response time of the switched-capacitor filter when the second means changes the input signal from the first signal to the second signal.

28. The signal processing circuit of claim 9, wherein the filter signal processing means comprises an amplifier having a gain resistor, and the circuit for drawing is operative for short-circuiting the gain resistor to quickly draw charges from the coupling capacitor.

29. The signal processing circuit of claim 10, wherein the filter signal processing means comprises an amplifier having a gain resistor, and the circuit for drawing is operative for short-circuiting the gain resistor to quickly draw charges from the coupling capacitor.

30. A signal processing circuit comprising:
signal selecting means for selecting and outputting one of plural input signals;
a filter connected to the signal selecting means and filtering the signal selected by the signal selecting means with a changeable center frequency of a pass band of the filtering, said filter comprising a switched-capacitor filter;
frequency changing means for temporarily changing the center frequency to a first value and then changing the center frequency to a second value different from the first value when the signal selected by the signal selecting means is changed from one to another; and
a pre-filter connected between the signal selecting means and the switched-capacitor filter.

31. A signal processing circuit comprising:
a filter filtering an input signal with a changeable center frequency of a pass band of the filtering, said filter comprising a switch-capacitor filter;
input signal state detecting means for detecting whether or not the input signal changes to a given state in response to a condition change including at least one of an engine speed change and an engine cylinder change;
frequency changing means for temporarily changing the center frequency to a first value and then changing the center frequency to a second value different from the first value when the input signal state detecting means detects that the input signal changes to the given state;
a coupling capacitor;
filter signal processing means connected via the coupling capacitor to an output side of the switched-capacitor filter, the filter signal processing means including a circuit for drawing charges from the coupling capacitor;
a peak hold circuit connected to a rear end of the filter signal processing means for holding a peak level of a filter signal; and
a post-filter including a combination of a capacitor and a resistor, the capacitor including a hold capacitor in the peak hold circuit.

32. A signal processing circuit comprising:
signal selecting means for selecting and outputting one of plural input signals;
a filter connected to the signal selecting means and filtering the signal selected by the signal selecting means with a changeable center frequency of a pass band of the filtering, said filter comprising a switched-capacitor filter;
frequency changing means for temporarily changing the center frequency to a first value and then changing the center frequency to a second value different from the first value when the signal selected by the signal selecting means is changed from one to another;
a coupling capacitor;
filter signal processing means connected via the coupling capacitor to an output side of the switched-capacitor filter, the filter signal processing means including a circuit for drawing charges from the coupling capacitor;
a peak hold circuit connected to a rear end of the filter signal processing means for holding a peak level of a filter signal; and
a post-filter including a combination of a capacitor and a resistor, the capacitor including a hold capacitor in the peak hold circuit.

33. The signal processing circuit of claim 31, further comprising a voltage follower circuit connected in parallel with the peak hold circuit, and switch means for selecting one of an output signal from the peak hold circuit and an output signal from the voltage follower circuit, wherein a time constant occurring selection of the output signal from the peak hold circuit is greater than a time constant occurring selection of the output signal from the voltage follower circuit.

34. The signal processing circuit of claim 32, further comprising a voltage follower circuit connected in parallel with the peak hold circuit, and switch means for selecting one of an output signal from the peak hold circuit and an output signal from the voltage follower circuit, wherein a time constant occurring selection of the output signal from the peak hold circuit is greater than a time constant occurring selection of the output signal from the voltage follower circuit.

35. A signal processing circuit comprising:
signal selecting means for selecting and outputting one of plural input signals;
a filter connected to the signal selecting means and filtering the signal selected by the signal selecting means with a changeable center frequency of a pass band of the filtering; and
frequency changing means for temporarily changing the center frequency to a first value and then changing the center frequency to a second value different from the first value when the signal selected by the signal selecting means is changed from one to another,
wherein the signal selecting means is operative for also selecting a reference voltage as an input signal in addition to the plural input signals, and a signal value occurring during selection of the reference voltage is detected as an offset voltage, and wherein the offset voltage is subtracted from a signal value occurring during selection of one of the plural input signals.

36. A signal processing circuit comprising:
signal selecting means for selecting and outputting one of plural input signals;
a filter connected to the signal selecting means and filtering the signal selected by the signal selecting means with a changeable center frequency of a pass band of the filtering, said filter comprising a switched-capacitor filter;
frequency changing means for temporarily changing the center frequency to a first value and then changing the center frequency to a second value different from the first value when the signal selected by the signal selecting means is changed from one to another;
a coupling capacitor; and
filter signal processing means connected via the coupling capacitor to an output side of the switched-capacitor filter, the filter signal processing means including a circuit for drawing charges from the coupling capacitor,
wherein a final stage of the filter signal processing means comprises an A/D converter, and a signal selector is provided in addition to the signal selecting means, and wherein the signal selector is operative for selecting one of the plural input signals and directly feeding the selected input signal to the A/D converter while enabling the selected input signal to bypass the switched-capacitor filter.

37. A signal processing circuit comprising:

a filter filtering an input signal with a changeable center frequency of a pass band of the filtering, said filter comprising a switch-capacitor filter;

input signal state detecting means for detecting whether or not the input signal changes to a given state in response to a condition change including at least one of an engine speed change and an engine cylinder change;

frequency changing means for temporarily changing the center frequency to a first value and then changing the center frequency to a second value different from the first value when the input signal state detecting means detects that the input signal changes to the given state;

a coupling capacitor; and filter signal processing means connected via the coupling capacitor to an output side of the switched-capacitor filter, the filter signal processing means including a circuit for drawing charges from the coupling capacitor, wherein a final stage of the filter signal processing means comprises an A/D converter, and a signal selector is provided, and wherein the signal selector is operative for selecting one of plural input signals and directly feeding the selected input signal to the A/D converter while enabling the selected input signal to bypass the switched-capacitor filter.

38. The signal processing circuit of claim 32, wherein the peak hold circuit comprises a reset circuit for discharging the hold capacitor to reset the held peak level.

39. The signal processing circuit of claim 31, wherein the peak hold circuit comprises a reset circuit for discharging the hold capacitor to reset the held peak level.

* * * * *

UNITED STATES PATENT AND TRADEMARK OFFICE
CERTIFICATE OF CORRECTION

PATENT NO. : 5,736,896
DATED : April 7, 1998
INVENTOR(S) : SAKISHITA, et al.

It is certified that error appears in the above-indentified patent and that said Letters Patent is hereby corrected as shown below:

Title page;
[75] Inventors: Please change resident city of the third inventor from "Anjo" to --Okazaki--.

Signed and Sealed this

Twenty-eighth Day of July, 1998

*Attest:*

BRUCE LEHMAN

*Attesting Officer*     *Commissioner of Patents and Trademarks*